(12) United States Patent
Yamamoto

(10) Patent No.: US 6,384,479 B1
(45) Date of Patent: May 7, 2002

(54) SEMICONDUCTOR INTEGRATED CIRCUIT DEVICE

(75) Inventor: Minehisa Yamamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/252,801

(22) Filed: Feb. 19, 1999

(30) Foreign Application Priority Data

Feb. 20, 1998 (JP) .......................................... 10-038288

(51) Int. Cl.⁷ .............................................. H01L 23/48
(52) U.S. Cl. ...................... 257/728; 257/500; 257/663; 257/758
(58) Field of Search .................. 257/728, 500, 257/662, 663, 664, 538, 758; 333/246, 247

(56) References Cited

U.S. PATENT DOCUMENTS

| | | | |
|---|---|---|---|
| 5,773,887 A | * 6/1998 | Pavio et al. ................ | 257/728 |
| 5,841,197 A | * 11/1998 | Adamic, Jr. ................ | 257/777 |
| 5,939,755 A | * 8/1999 | Takeuchi et al. ............ | 257/347 |
| 5,994,759 A | * 11/1999 | Darmawan et al. ......... | 257/538 |
| 6,072,223 A | * 6/2000 | Noble ........................ | 257/390 |

* cited by examiner

Primary Examiner—Eddie Lee
Assistant Examiner—Lourdes Cruz
(74) Attorney, Agent, or Firm—Arent Fox Kintner Plotkin & Kahn, PLLC

(57) ABSTRACT

In a semiconductor integrated circuit device, a digitally operating control circuit has a high-frequency circuit, which handles signals of relatively high frequencies, and a low-frequency circuit, which handles signals of relatively low frequencies. The high-frequency and low-frequency circuits are arranged as separate blocks. A plurality of conductor layers are provided, and, the wiring of the low-frequency circuit is achieved without using particular one or ones of those conductor layers.

2 Claims, 3 Drawing Sheets

SEMICONDUCTOR INTEGRATED CIRCUIT DEVICE

BACKGROUND OF THE INVENTION

1. Field of the Invention

The present invention relates to a semiconductor integrated circuit device, and particularly to a semiconductor integrated circuit device having an analog circuit and a digital circuit formed on a single substrate.

2. Description of the Prior Art

An IC (integrated circuit) designed for use in an FDD (floppy disk drive) (hereafter such an IC will be referred to as an "FDD IC") has a read/write circuit for writing and reading data to and from a floppy disk as well as a control circuit for controlling the read/write circuit. Whereas the control circuit is a digital circuit formed by logic circuits composed of CMOS (complementary metal-oxide semiconductor) devices, the read/write circuit is an analog circuit composed of bipolar transistors. Conventionally, an analog circuit and a digital circuit are arranged as separate blocks, and the control circuit and the read/write circuit are arranged next to each other.

Arranging the control circuit as a separate block in this way, however, makes it inevitable that the control circuit is given an unnecessarily large block size. This means that the wiring pattern that is laid to give the control circuit necessary functions has to cover an unnecessarily large area (i.e. the wiring has to cover an unnecessarily large area), and thus causes an unduly long delay in signal transfer (i.e. signals come to have "blunt" rising and trailing edges). As a result, unless the CMOS devices forming the control circuit have an extremely high driving capacity, it is not possible to secure a sufficient margin for the operation speed of the control circuit (in particular, the high-frequency handling portion thereof). This makes it impossible to achieve a satisfactorily high yield of an FDD IC, and thereby makes the costs of the FDD IC, and thus the costs of the FDD apparatus employing it, unnecessarily high.

Moreover, a long delay in signal transfer reduces the switching speed of the CMOS devices forming the control circuit, and thereby lengthens the period in which through currents flow through the CMOS devices. This leads to unduly high power consumption.

The control circuit includes, as its internal circuits, a circuit that handles high-frequency signals (hereafter such a circuit will be referred to as a "high-frequency" circuit) and a circuit that handles low-frequency signals (hereafter such a circuit will be referred to as a "low-frequency" circuit). Since the control circuit is conventionally arranged as one block, the read/write circuit, which is an analog circuit, has to be arranged next to the high-frequency circuit provided within the control circuit. The problem here is that the operation of the high-frequency circuit causes noise that degenerates the operation characteristics of an analog circuit. For this reason, conventionally, a guard ring is provided between the control circuit and the read/write circuit to buffer such noise (specifically, as large a gap as possible is secured between the control circuit and the read/write circuit). This, however, leads to a reduced circuit density, an increased chip area, and increased costs of the FDD IC, and thus makes the size and the costs of the FDD apparatus employing it even higher.

SUMMARY OF THE INVENTION

An object of the present invention is to provide a semiconductor integrated circuit device that allows redundancy in a low-frequency circuit included in a digital circuit provided therein, that operates with lower power consumption, and that can be manufactured with a smaller circuit area and at lower costs.

To achieve the above object, according to the present invention, in a semiconductor integrated circuit device having an analog circuit and a digital circuit formed as separated blocks on a single substrate and having a plurality of conductor layers, a high-frequency circuit belonging to the digital circuit that handles signals of relatively high frequencies and a low-frequency circuit belonging to the digital circuit that handles signals of relatively low frequencies are arranged as separate blocks, and in addition the wiring of the low-frequency circuit is achieved without using particular one or ones of the conductor layers.

Here, arranging the high-frequency and low-frequency circuits as separate blocks helps reduce the area that needs to be covered by a wiring pattern in each circuit so as to give the circuit necessary functions, and thus helps minimize the delay in signal transfer that occurs in each circuit. In addition, the high-frequency and low-frequency circuits, when arranged as separate blocks, are allowed to use the conductor layers in different ways.

Thus, in the above-described configuration according to the present invention, the low-frequency circuit is given necessary functions by being wired without using particular one or ones of the conductor layers provided. This makes it possible to alter the wiring by using the particular one or ones of the conductor layers that were previously left unused.

Note that the greater the number of conductor layers that are used to give circuits their respective functions, the shorter the individual wiring paths, and thus the shorter the delay in signal transfer. That is, the low-frequency circuit is affected less seriously by the delay in signal transfer than the high-frequency circuit is. Therefore, with the low-frequency circuit, it is advisable to give priority to securing as much redundancy as possible rather than to minimizing the delay in signal transfer. On the other hand, with the high-frequency circuit, to which the delay in signal transfer does more harm than redundancy does good, it is advisable to design the wiring pattern in such a way as to minimize the delay in signal transfer at the cost of redundancy.

A shorter delay in signal transfer helps increase the switching speed of the CMOS devices forming the digital circuit, and thereby shorten the period in which through currents flow through the CMOS devices.

Moreover, arranging the high-frequency and low-frequency circuits of the digital circuit as separate blocks helps reduce the space that needs to be secured as a guard ring between the analog circuit and the high-frequency circuit to buffer noise.

Furthermore, arranging the low-frequency circuit between the high-frequency circuit and the analog circuit helps make the analog circuit less susceptible to the noise resulting from the operation of the high-frequency circuit.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 4:
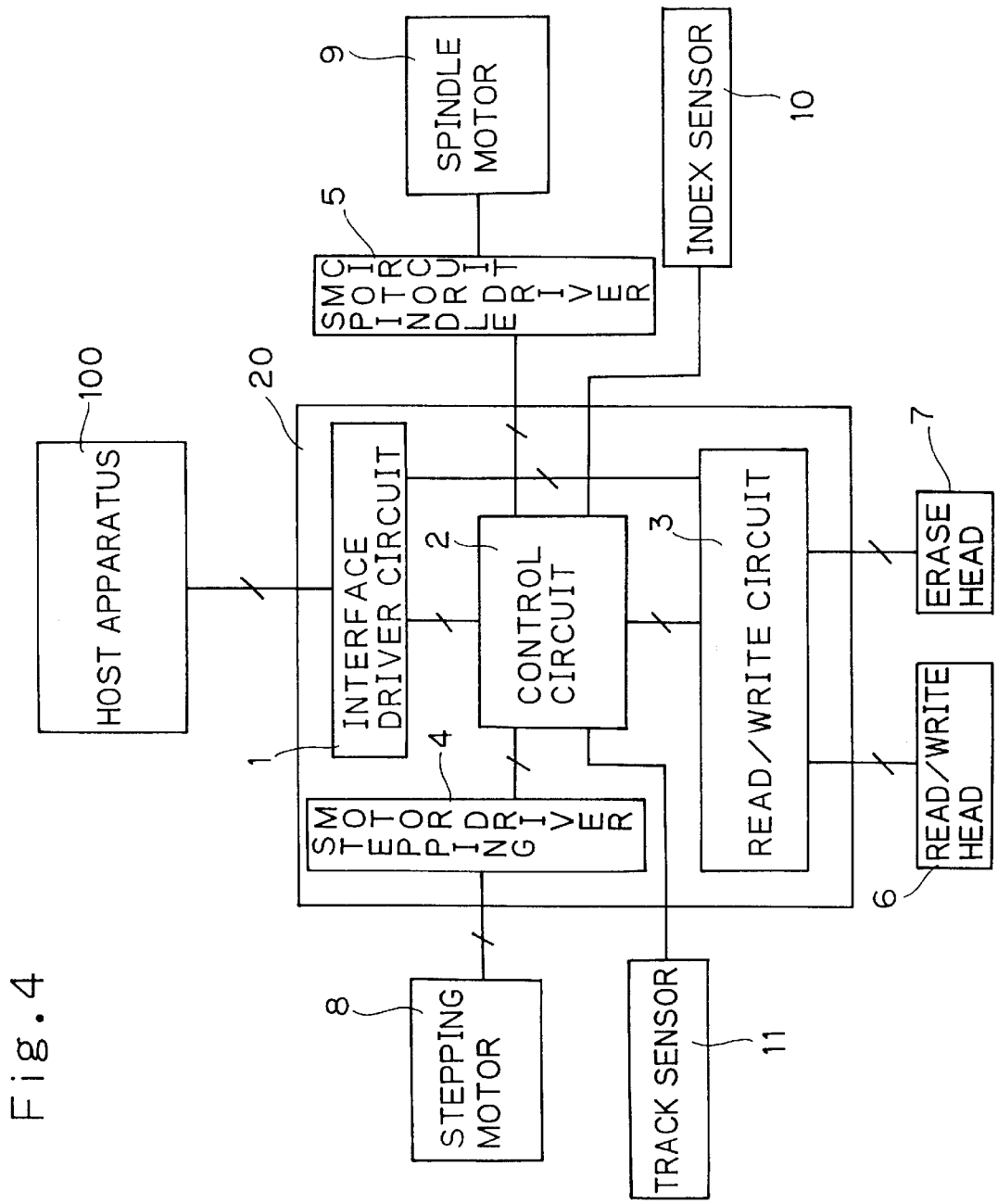
FIG. 4 is a block diagram of an FDD apparatus taken as an example of a magnetic disk apparatus employing a semiconductor integrated circuit device embodying the invention.

Hereinafter, embodiments of the present invention will be described with reference to the accompanying drawings. FIG. 4 shows an FDD IC (an IC designed for use in an FDD) 20 embodying the present invention, together with the portions relevant thereto of the FDD apparatus employing it. As shown in this figure, the FDD apparatus includes an interface driver circuit 1, a control circuit 2, a read/write circuit 3, a stepping motor driver circuit 4, a spindle motor driver circuit 5, a read/write head 6, an erase head 7, a stepping motor 8, a spindle motor 9, an index sensor 10, and a track sensor 11, and is connected to an external host apparatus 100 such as a personal computer. The interface driver circuit 1, control circuit 2, read/write circuit 3, and stepping motor driver circuit 4 are formed within one-chip semiconductor integrated circuit device, i.e. within the FDD IC 20.

The individual components shown in FIG. 4 operate as follows. The interface driver circuit 1 coordinates the data format and the transfer method of the data exchanged between the host apparatus 100 and the control circuit 2, and of the data exchanged between the host apparatus 100 and the read/write circuit 3, the latter including the data that is going to be written to a magnetic disk (not shown) and the data that has just been read from the magnetic disk.

The control circuit 2, in accordance with the data fed thereto from the host apparatus 100 through the interface driver circuit 1, controls the writing and reading of data to and from the magnetic disk. In exchange, the control circuit 2 feeds the data related to the operation status of the FDD apparatus and the like to the host apparatus 100 through the interface driver circuit 1.

Under the control of the control circuit 2, the read/write circuit 3, during data writing, feeds the coils of the read/write head 6 (used to write and read data to and from the magnetic disk) and of the erase head 7 (used to erase data from the magnetic disk) with electric currents in accordance with the data fed from the host apparatus 100 through the interface driver circuit 1, and thereby writes the data to the magnetic disk. On the other hand, during data reading, the read/write circuit 3, on the basis of the voltage that appears in the coil of the read/write head 6 in accordance with the data recorded on the magnetic disk, reads the data from the magnetic disk, and feeds the obtained data to the host apparatus 100 through the interface driver circuit 1.

The stepping motor driver circuit 4, under the control of the control circuit 2, drives the stepping motor 8 to transport the read/write head 6 and the erase head 7 radially across the magnetic disk. The spindle motor driver circuit 5, under the control of the control circuit 2, drives the spindle motor 9 to rotate the magnetic disk.

The index sensor 10 enables the control circuit 2 to detect whether the magnetic disk is rotating normally or not, and the track sensor 11 enables the control circuit 2 to detect whether the read/write head 6 and the erase head 7 are positioned at the outermost edge of the magnetic disk or not.

In the FDD IC 20, the control circuit 2 is a digital circuit formed by logic circuits composed of CMOS devices, and the read/write circuit 3 is an analog circuit composed of bipolar transistors.

Figure 1:
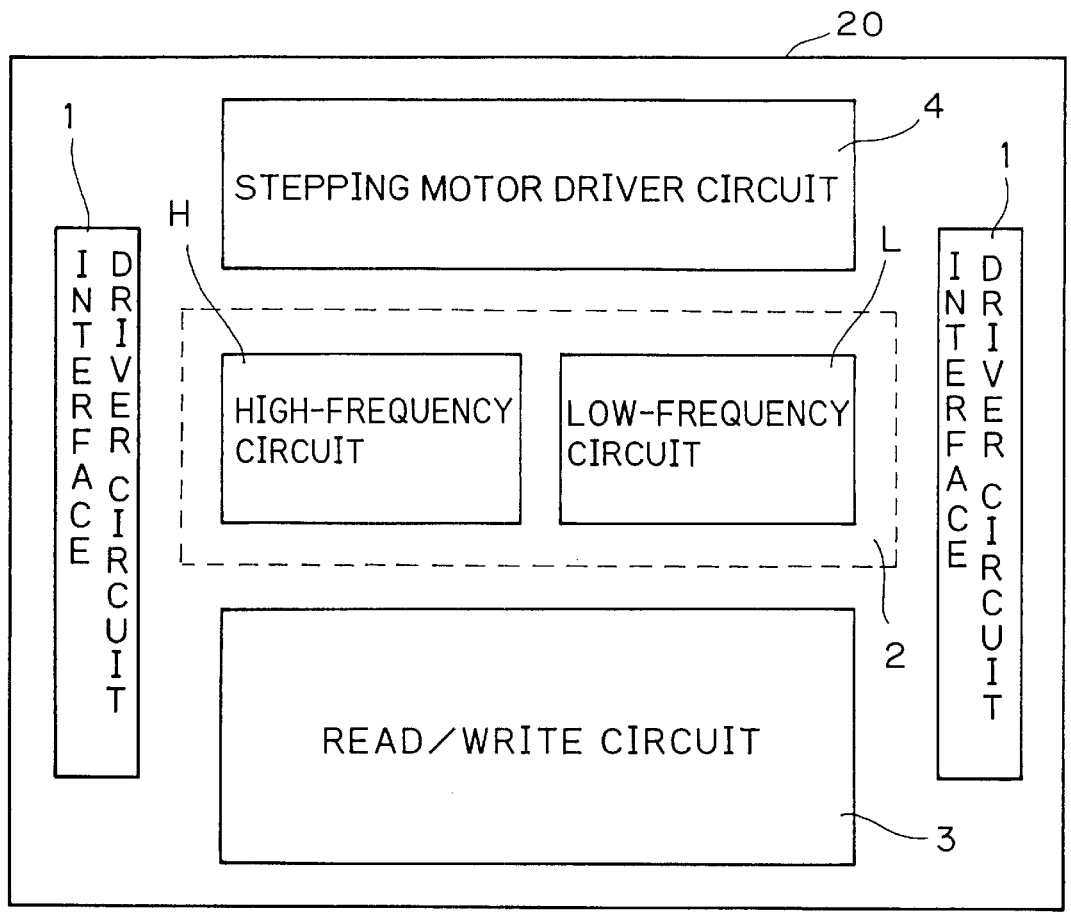
FIG. 1 is a diagram showing an example of the arrangement of blocks in the FDD IC of a first embodiment of the invention.

FIG. 1 shows the arrangement of blocks in the FDD IC 20. In FIG. 1, not only are the individual circuits arranged as separate blocks, but also the high-frequency circuit H and the low-frequency circuit L of the control circuit 2 are arranged as separate blocks. Note that, in this embodiment, the high-frequency circuit includes circuits that chiefly handle signals of frequencies around 20 MHz, e.g. a PLL circuit, and the low-frequency circuit includes circuits that chiefly handle signals of frequencies around 4 MHz, though this should not be regarded as restricting in any way the way circuits are classified in practice.

Figure 2:
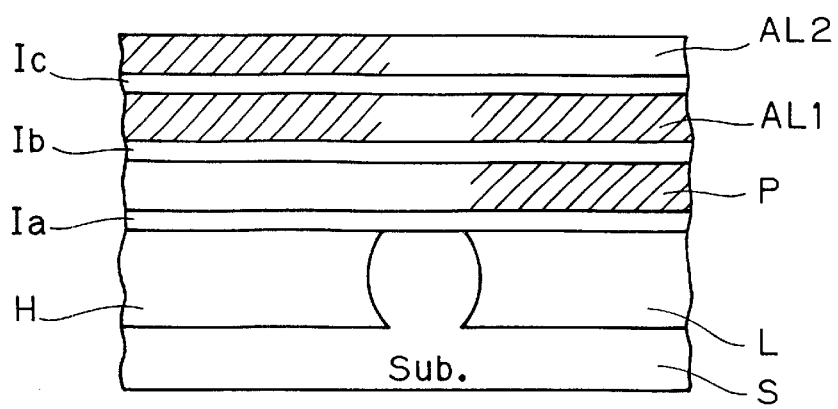
FIG. 2 is a diagram showing a sectional view of the FDD IC shown in FIG. 1.

FIG. 2 shows a sectional view of the FDD IC 20. As shown in FIG. 2, the FDD IC 20 has the high-frequency and low-frequency circuits H and L formed in a semiconductor substrate S, and has a plurality of conductor layers (in this embodiment, three layers) P, $AL_1$, and $AL_2$ laid over them, with insulating layers Ia, Ib, and Ic laid in between so as to insulate the conductor layers P, $AL_1$, and $AL_2$ and the substrate S from one another. Of those three conductor layers, the bottommost one P is a conductor layer of polysilicon, and the two upper ones $AL_1$ and $AL_2$ are conductor layers of aluminum. The low-frequency circuit L is given necessary functions by being wired mainly by the use of the polysilicon conductor layer P and the aluminum conductor layer $AL_1$, i.e. by being wired almost without using the topmost aluminum conductor layer $AL_2$, which is the conductor layer that is formed last. On the other hand, the high-frequency circuit H is given necessary functions by being wired mainly by the use of the aluminum conductor layers $AL_1$ and $AL_2$, which have a lower resistance than the polysilicon conductor layer P.

Thus, the low-frequency circuit L is wired almost without using the topmost aluminum conductor layer $AL_2$, and therefore its wiring can be altered by the use of this conductor layer. In this way, redundancy is secured in the low-frequency circuit. Moreover, the high-frequency and low-frequency circuits H and L are arranged as separate blocks, and therefore it is possible to reduce the area that needs to be covered by the wiring to give each circuit necessary functions, and thereby shorten the delay in signal transfer. In addition, the high-frequency circuit H is given necessary functions by being wired mainly by the use of the aluminum conductor layers $AL_1$ and $AL_2$ having a lower resistance, and therefore the delay in signal transfer therein can be further shortened.

In this way, arranging the high-frequency and low-frequency circuits H and L of the control circuit 2 as separate blocks permits the high-frequency and low-frequency circuits H and L to use the conductor layers in different ways. For example, in this embodiment, the conductor layers are used in such a way that priority is given to securing redundancy in the low-frequency circuit L and to shortening the delay in signal transfer in the high-frequency circuit L.

By shortening the delay in signal transfer in the high-frequency circuit H, it is possible to secure a sufficient margin for the operation speed of the control circuit 2, and thereby widen the range of permissible variations in the characteristics of the circuit elements used. This helps improve the yield of the FDD IC 20, and thereby reduce the costs of the FDD IC, and thus the costs of the FDD apparatus employing it.

Moreover, by shortening the delay in signal transfer, it is possible to make faster the switching speed of the CMOS devices forming the control circuit 2. This helps shorten the period in which through currents flow through the CMOS devices, and thereby reduce power consumption.

Furthermore, arranging the high-frequency and low-frequency circuits H and L of the control circuit 2 as separate blocks makes it possible to reduce the space that needs to be secured as a guard ring between the read/write circuit 3, which is an analog circuit, and the control circuit 2, which is a digital circuit, to buffer noise. This helps improve the circuit density, reduce the chip area, and reduce the costs of the FDD IC, and thus helps reduce the size and the costs of the FDD apparatus employing it.

Figure 3:
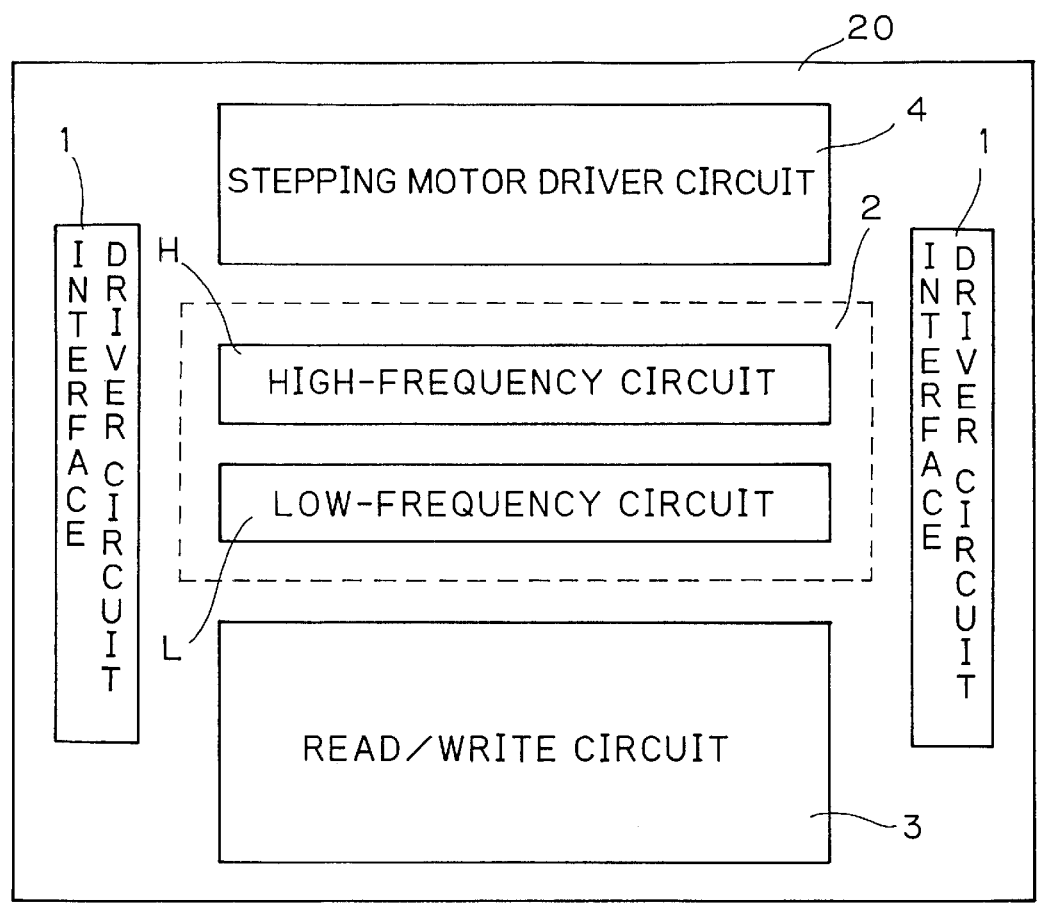
FIG. 3 is a diagram showing an example of the arrangement of blocks in the FDD IC of a second embodiment of the invention.

In a second embodiment of the present invention shown in FIG. 3, the low-frequency circuit L is arranged between the high-frequency circuit H and the read/write circuit 3. Here, the low-frequency circuit L acts as a guard ring as is conventionally provided, and thereby makes the read/write circuit 3 less susceptible to the noise resulting from the operation of the high-frequency circuit H. Accordingly, almost no space needs to be secured as a guard ring. This helps reduce the circuit area and the costs of the FDD IC, and thus helps further reduce the size and costs of the FDD apparatus employing it.

In the embodiments described above, it is assumed that the high-frequency and low-frequency circuits H and L handle signals of frequencies around 20 MHz and 4 MHz, respectively. It is to be understood, however, that what frequencies are regarded as high or low is determined on a relative basis and thus arbitrarily to suit specific applications. Moreover, it is also possible to use copper conductors instead of aluminum conductors. Moreover, the FDD IC does not necessarily have to include a motor driver.

What is claimed is:

1. A semiconductor integrated circuit device having an analog circuit and a digital circuit formed on a semiconductor substrate, comprising:

a first block in which a high frequency circuit belonging to said digital circuit is formed;

a second block in which a low-frequency circuit belonging to said digital circuit is formed;

a high-frequency conductor layer formed on the semiconductor substrate and having conductors for wiring the high-frequency circuit formed in said first block; and a low-frequency conductor layer formed on the semiconductor substrate and having conductors for wiring the low-frequency circuit formed in said second block, the conductors of said low-frequency conductor layer having a higher resistance than the conductors of said high-frequency conductor layer;

wherein circuit elements in the first block are wired using a plurality of metal conductors among the conductors of said high-frequency conductor layer laid above said circuit elements, and circuit elements in the second block are wired using a first metal conductor and a second conductor among the conductors of said low-frequency conductor layer laid above said circuit elements, the second conductor having a higher resistance than the metal conductors of said high-frequency conductor layer.

2. A semiconductor integrated circuit device comprising:

a read/write circuit, operating on an analog basis, for writing and reading data to and from a magnetic disk;

a control circuit, operating on a digital basis, for controlling writing and reading of data;

a first block in which a high-frequency circuit belonging to said control circuit is formed;

a second block in which a low-frequency circuit belonging to said digital circuit is formed;

a high-frequency conductor layer formed on a semiconductor substrate and having conductors for wiring the high-frequency circuit formed in said first block; and a low-frequency conductor layer formed on the semiconductor substrate and having conductors for wiring the low-frequency circuit formed in said second block, the conductors of said low-frequency conductor layer having a higher resistance than the conductors of said high-frequency conductor layer;

wherein circuit elements in the first block are wired using a plurality of metal conductors among the conductors of said high-frequency conductor layer laid above said circuit elements, and circuit elements in the second block are wired using a first metal conductor and a second conductor among the conductors of said low-frequency conductor layer laid above said circuit elements, the second conductor having a higher resistance than the plurality of metal conductors of said high-frequency conductor layer.

* * * * *